(12) United States Patent
Masuoka

(10) Patent No.: US 10,355,142 B2
(45) Date of Patent: Jul. 16, 2019

(54) SEMICONDUCTOR DEVICE

(71) Applicant: Mitsubishi Electric Corporation, Tokyo (JP)

(72) Inventor: Fumihito Masuoka, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 15/766,114

(22) PCT Filed: Feb. 29, 2016

(86) PCT No.: PCT/JP2016/056087
§ 371 (c)(1),
(2) Date: Apr. 5, 2018

(87) PCT Pub. No.: WO2017/149607
PCT Pub. Date: Sep. 8, 2017

(65) Prior Publication Data
US 2018/0315863 A1 Nov. 1, 2018

(51) Int. Cl.
H01L 29/227 (2006.01)
H01L 29/861 (2006.01)
(Continued)

(52) U.S. Cl.
CPC ........ H01L 29/861 (2013.01); H01L 29/0688 (2013.01); H01L 29/36 (2013.01);
(Continued)

(58) Field of Classification Search
CPC .... H01L 29/861; H01L 29/0688; H01L 29/36
(Continued)

(56) References Cited

U.S. PATENT DOCUMENTS 4,587,547 A    5/1986  Amemiya et al.
9,601,639 B2 * 3/2017  Masuoka ............ H01L 29/0692
                        (Continued)

FOREIGN PATENT DOCUMENTS

JP    S56-037683 A    4/1981
JP    H02-086173 A    3/1990
                   (Continued)

OTHER PUBLICATIONS

International Search Report issued in PCT/JP2016/056087; dated May 10, 2016.
(Continued)

Primary Examiner — Luan C Thai
(74) Attorney, Agent, or Firm — Studebaker & Brackett PC

(57) ABSTRACT

First and second p-type anode layers (2,3) are provided side by side on a drift layer (1). N-type cathode layer (5) and p-type cathode layer (6) are provided side by side below the drift layer (1). An n-type buffer layer (7) is provided between the drift layer (1) and the n-type cathode layer (5) and between the drift layer (1) and the p-type cathode layer (6). The first p-type anode layer (2,2a,2b) has a greater diffusion depth than a diffusion depth of the second p-type anode layer (3). The first p-type anode layer (2,2a,2b) has a greater impurity concentration than an impurity concentration of the second p-type anode layer (3). The n-type cathode layer (5) has a greater diffusion depth than a diffusion depth of the p-type cathode layer (6). The n-type cathode layer (5) has a greater impurity concentration than an impurity concentration of the p-type cathode layer (6).

4 Claims, 2 Drawing Sheets

(51) Int. Cl.
    *H01L 29/36*   (2006.01)
    *H01L 29/06*   (2006.01)
    *H01L 29/16*   (2006.01)
    *H01L 29/20*   (2006.01)

(52) U.S. Cl.
    CPC ...... *H01L 29/1602* (2013.01); *H01L 29/1608* (2013.01); *H01L 29/2003* (2013.01)

(58) Field of Classification Search
    USPC ........................................................ 257/655
    See application file for complete search history.

(56) References Cited

U.S. PATENT DOCUMENTS

| 2014/0070379 A1 | 3/2014 | Ishimaru et al. |
| 2016/0056306 A1 | 2/2016 | Masuoka et al. |

FOREIGN PATENT DOCUMENTS

| JP | H07-106605 A | 4/1995 |
| JP | 2014-053451 A | 3/2014 |
| WO | 2014/199465 A1 | 12/2014 |
| WO | 2017/051464 A1 | 3/2017 |

OTHER PUBLICATIONS

Written Opinion issued in PCT/JP2016/056087; dated May 10, 2016.

Notification of Transmittal of the International Search Report and the Written Opinion of the International Searching Authority, or the Declaration issued in PCT/JP2016/056087; dated May 10, 2016.

Notification of Transmittal of Translation of the International Preliminary Report on Patentability issued in PCT/JP2016/056087; dated Sep. 13, 2018.

* cited by examiner

SEMICONDUCTOR DEVICE

FIELD

The present invention relates to a semiconductor device.

BACKGROUND

Semiconductor diodes have been developed in recent years (see, for example, PTL 1). Conventionally, as a method of controlling the $V_F$-$E_{REC}$ trade-off characteristics of semiconductor diodes, lifetime control that uses heavy metal diffusion or electron/ion beam irradiation techniques has been adopted.

CITATION LIST

Patent Literature

[PTL1] Japanese Patent Application Laid-open No. H02-86173

SUMMARY

Technical Problem

With lifetime control, however, the $V_F$-$E_{REC}$ trade-off characteristics vary largely depending on the irradiation angle with the irradiated object, the temperature or the like during the electron/ion beam irradiation. There were also other problems, such as fluctuations in electrical characteristics caused by changes in the lattice defects due to self-heating during powered chip operation, and thermal runaway during high-temperature operation caused by a large leak current due to the lattice defects.

The present invention was made to solve the problem described above and it is an object of the invention to obtain a semiconductor device capable of adjusting the $V_F$-$E_{REC}$ trade-off characteristics without relying on lifetime control.

Solution to Problem

A semiconductor device according to the present invention includes: a drift layer; first and second p-type anode layers provided side by side on the drift layer; n-type cathode layer and p-type cathode layer provided side by side below the drift layer; and an n-type buffer layer provided between the drift layer and the n-type cathode layer and between the drift layer and the p-type cathode layer, wherein the first p-type anode layer has a greater diffusion depth than a diffusion depth of the second p-type anode layer, the first p-type anode layer has a greater impurity concentration than an impurity concentration of the second p-type anode layer, the n-type cathode layer has a greater diffusion depth than a diffusion depth of the p-type cathode layer, and the n-type cathode layer has a greater impurity concentration than an impurity concentration of the p-type cathode layer.

Advantageous Effects of Invention

In the present invention, the first p-type anode layer has a greater diffusion depth than a diffusion depth of the second p-type anode layer, the first p-type anode layer has a greater impurity concentration than an impurity concentration of the second p-type anode layer, the n-type cathode layer has a greater diffusion depth than a diffusion depth of the p-type cathode layer, and the n-type cathode layer has a greater impurity concentration than an impurity concentration of the p-type cathode layer. Therefore, the $V_F$-$E_{REC}$ trade-off characteristics can be adjusted over a wide range without having to rely on the lifetime control.

DESCRIPTION OF EMBODIMENTS

A semiconductor device according to the embodiments of the present invention will be described with reference to the drawings. The same components will be denoted by the same symbols, and the repeated description thereof may be omitted.

Embodiment 1

Figure 1:
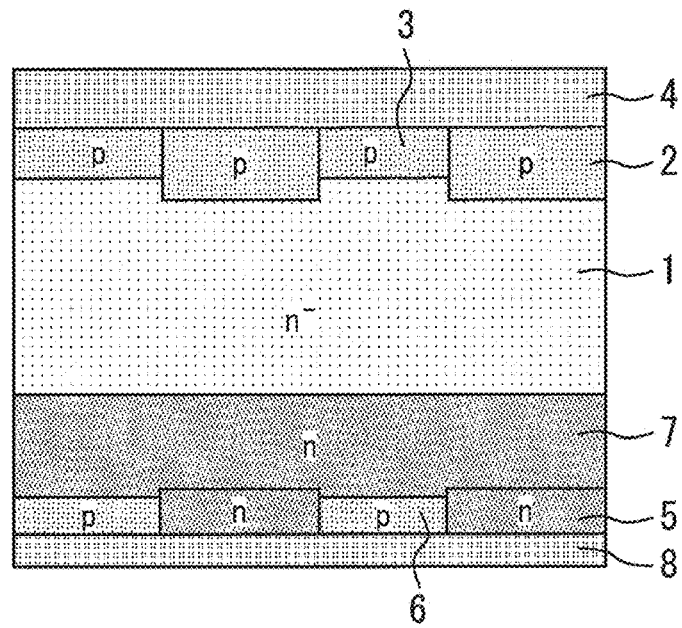
FIG. 1 is a cross-sectional view of a semiconductor device according to Embodiment 1 of the present invention.

FIG. 1 is a cross-sectional view of a semiconductor device according to Embodiment 1 of the present invention. First and second p-type anode layers 2 and 3 are formed side by side on an n$^-$-type drift layer 1. An anode electrode 4 is connected in ohmic contact with the first and second p-type anode layers 2 and 3.

N-type cathode layers 5 and p-type cathode layers 6 are formed side by side below the n$^-$-type drift layer 1. An n-type buffer layer 7 is formed between the n$^-$-type drift layer 1 and the n-type cathode layers 5 and between the n$^-$-type drift layer 1 and p-type cathode layers 6. A cathode electrode 8 is connected in ohmic contact with the n-type cathode layers 5 and p-type cathode layers 6. The n-type cathode layers 5 and p-type cathode layers 6 are short-circuited via the cathode electrode 8.

In this embodiment, the first p-type anode layers 2 have a greater diffusion depth xp2 than the diffusion depth xp3 of the second p-type anode layers 3 (xp2>xp3). The first p-type anode layers 2 have a greater impurity concentration cp2 than the impurity concentration cp3 of the second p-type anode layers 3 (cp2>cp3). The n-type cathode layers 5 have a greater diffusion depth xn2 than the diffusion depth xp1 of the p-type cathode layers 6 (xn2>xp1). The n-type cathode layers 5 have a greater impurity concentration cn2 than the impurity concentration cp1 of the p-type cathode layers 6 (cn2>cp1).

If the backside p/n pitch, which is the pitch of one cycle made by the n-type cathode layer 5 and p-type cathode layer 6, is made smaller, $V_F$ increases, while $E_{REC}$ decreases. Namely, the $V_F$-$E_{REC}$ trade-off curve shifts to the high-speed side. Therefore, as a free-wheeling diode to be integrated in inverters adopted to various purposes, it is desirable that the $V_F$-$E_{REC}$ trade-off characteristics be adjustable by changing the backside p/n pitch. However, if the backside p/n pitch is designed too small, the snap-off tolerance will decrease. Conversely, if the pitch is designed too large, the recovery tolerance will be lowered. The settings of the diffusion depth and impurity concentration of this embodiment allow such a trade-off to be avoided.

If the backside p/n short-circuit ratio, which is the ratio of the p-type cathode layers 6 relative to the backside p/n pitch, is made smaller, $V_F$ increases, while $E_{REC}$ decreases. Namely, the $V_F$-$E_{REC}$ trade-off curve shifts to the high-speed side. Therefore, as a free-wheeling diode to be integrated in inverters adopted to various purposes, it is desirable that the $V_F$-$E_{REC}$ trade-off characteristics be adjustable by changing the backside p/n short-circuit ratio. However, if the backside p/n short-circuit ratio is designed too small, the snap-off tolerance will decrease while the cross point will increase. Conversely, if the ratio is designed too large, the recovery tolerance will be lowered. The anode structure design of this embodiment allows such a trade-off to be avoided.

If the concentration of the p-type anode layers is reduced, $V_F$ increases, while $E_{REC}$ decreases. Namely, the $V_F$-$E_{REC}$ trade-off curve shifts to the high-speed side. As a side effect, the carrier concentration on the ON-state anode side will decrease so that Irr of the recovery waveform is reduced, which relatively enhances the carrier concentration on the cathode side, whereby the snap-off tolerance can be improved. On the other hand, if the concentration of the p-type anode layers is reduced too much, the breakdown voltage will be lowered. The anode structure design of this embodiment allows such a trade-off to be avoided.

By setting the diffusion depth and impurity concentration as in this embodiment, the $V_F$-$E_{REC}$ trade-off characteristics can be adjusted over a wide range without having to rely on the conventional lifetime control. Thus the snap-off, which is a voltage surge toward the end of the turn-off operation, and oscillation triggered by the snap-off can be prevented. This way, cutoff performance such as controllable current density and tolerable cutoff speed during the turn-off operation can be improved.

Embodiment 2

Figure 2:
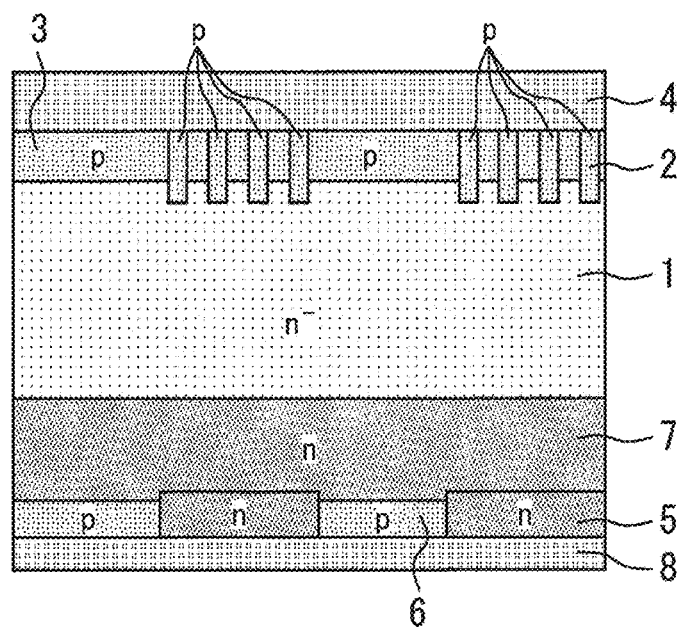
FIG. 2 is a cross-sectional view illustrating a semiconductor device according to Embodiment 2 of the present invention.

FIG. 2 is a cross-sectional view illustrating a semiconductor device according to Embodiment 2 of the present invention. The first p-type anode layers 2 have a smaller pitch than that of the n-type cathode layers 5.

The maximum cutoff current density at recovery is lowered in diodes having a vertically parasitic bipolar transistor structure as compared to diodes without such a structure. By setting the pitch of the first p-type anode layers 2 as in this embodiment, the operation of the vertically parasitic bipolar transistor is inhibited, so that the maximum controllable current density at recovery can be prevented from decreasing. Similar effects as those of Embodiment 1 can also be achieved.

Embodiment 3

Figure 3:
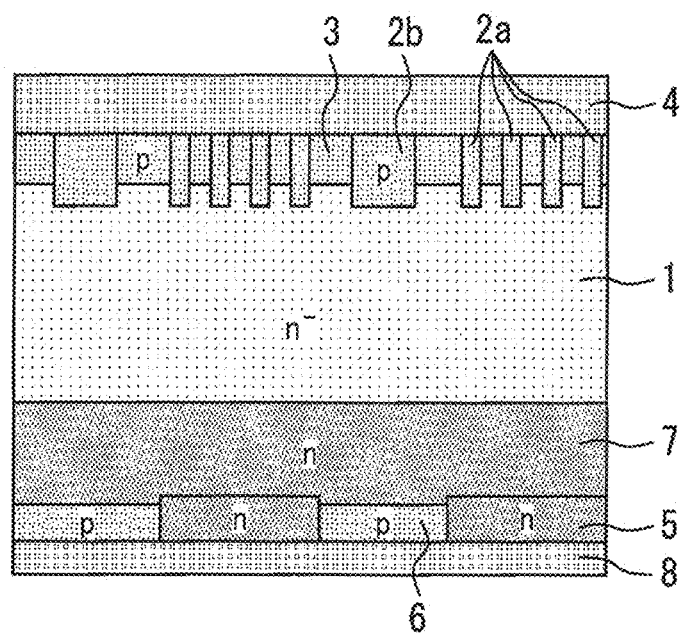
FIG. 3 is a cross-sectional view illustrating a semiconductor device according to Embodiment 3 of the present invention.

FIG. 3 is a cross-sectional view illustrating a semiconductor device according to Embodiment 3 of the present invention. The first p-type anode layers 2a above the n-type cathode layers 5 have a smaller pitch than that of the first p-type anode layers 2b above the p-type cathode layers 6. This inhibits the operation of the vertically parasitic bipolar transistor, so that the maximum controllable current density at recovery can be prevented from decreasing. Similar effects as those of Embodiment 1 can also be achieved.

Embodiment 4

Figure 4:
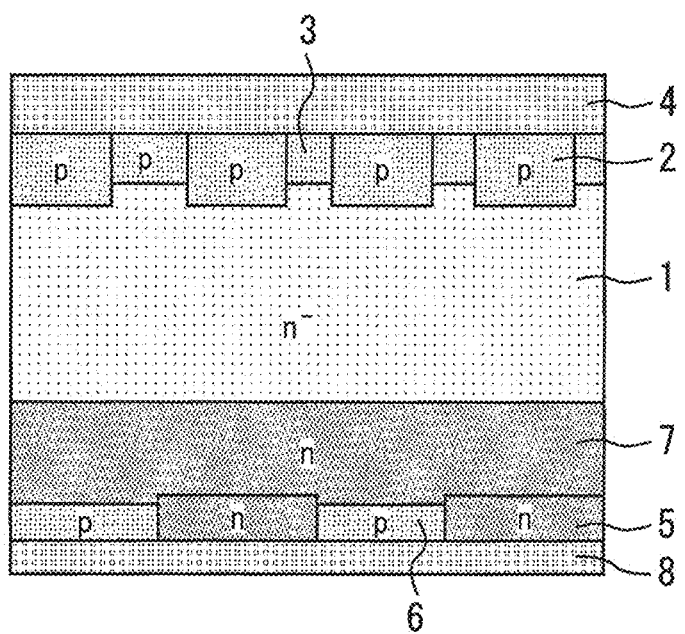
FIG. 4 is a cross-sectional view illustrating a semiconductor device according to Embodiment 4 of the present invention.

FIG. 4 is a cross-sectional view illustrating a semiconductor device according to Embodiment 4 of the present invention. The pitch of one cycle made by the first p-type anode layer 2 and second p-type anode layer 3 is smaller than the pitch of one cycle made by the n-type cathode layer 5 and p-type cathode layer 6. This inhibits the operation of the vertically parasitic bipolar transistor, so that the maximum controllable current density at recovery can be prevented from decreasing. Similar effects as those of Embodiment 1 can also be achieved.

While Embodiments 1 to 4 have, been described with respect to a diode that forms a high-breakdown-voltage power module (≥600 V) as one example, the present invention can be applied also to a range of diodes such as RC-IGBTs regardless of breakdown voltage class and semiconductor material, with the effects described above.

The semiconductor device is not limited to a device formed of silicon, but instead may be formed of a wide-bandgap semiconductor having a bandgap wider than that of silicon. The wide-bandgap semiconductor is, for example, a silicon carbide, a gallium-nitride-based material, or diamond. A power semiconductor device formed of such a wide-bandgap semiconductor has a high voltage resistance and a high allowable current density, and thus can be miniaturized. The use of such a miniaturized semiconductor device enables the miniaturization and high integration of the semiconductor module in which the semiconductor device is incorporated. Further, since the semiconductor device has a high heat resistance, a radiation fin of a heatsink can be miniaturized and a water-cooled part can be air-cooled, which leads to further miniaturization of the semiconductor module. Further, since the semiconductor device has a low power loss and a high efficiency, a highly efficient semiconductor module can be achieved.

REFERENCE SIGNS LIST 1 n⁻-type drift layer; 2,2a,2b first p-type anode layer; 3 second p-type anode layer; 5 n-type cathode layer; 6 p-type cathode layer; 7 n-type buffer layer

The invention claimed is:
1. A semiconductor device comprising:
a drift layer;
first and second p-type anode layers provided side by side on the drift layer;
n-type cathode layer and p-type cathode layer provided side by side below the drift layer; and
an n-type buffer layer provided between the drift layer and the n-type cathode layer and between the drift layer and the p-type cathode layer,
wherein the first p-type anode layer has a greater diffusion depth than a diffusion depth of the second p-type anode layer,
the first p-type anode layer has a greater impurity concentration than an impurity concentration of the second p-type anode layer,
the n-type cathode layer has a greater diffusion depth than a diffusion depth of the p-type cathode layer, and
the n-type cathode layer has a greater impurity concentration than an impurity concentration of the p-type cathode layer.
2. The semiconductor device according to claim 1, wherein the first p-type anode layer has a smaller pitch than a pitch of the n-type cathode layer.
3. The semiconductor device according to claim 1, wherein the first p-type anode layer above the n-type cathode layer has a smaller pitch than a pitch of the first p-type anode layer above the p-type cathode layer.

4. The semiconductor device according to claim 1, wherein a pitch of one cycle made by the first p-type anode layer and the second p-type anode layer is smaller than a pitch of one cycle made by the n-type cathode layer and the p-type cathode layer.

\* \* \* \* \*